United States Patent [19]
Kim

[11] Patent Number: 5,466,618
[45] Date of Patent: Nov. 14, 1995

[54] METHOD FOR FABRICATING A THIN FILM TRANSISTOR FOR A LIQUID CRYSTAL DISPLAY

[75] Inventor: Jin H. Kim, Kyungki, Rep. of Korea

[73] Assignee: Goldstar Co., Ltd., Youngdungpo, Rep. of Korea

[21] Appl. No.: 366,224

[22] Filed: Dec. 29, 1994

[30] Foreign Application Priority Data

Dec. 29, 1993 [KR] Rep. of Korea ............... 30957/1993

[51] Int. Cl.⁶ ........................................... H01L 21/786
[52] U.S. Cl. ..................... 437/40; 437/51; 437/181; 437/246; 437/913
[58] Field of Search ................ 437/40, 913, 41, 437/181, 51, 101, 246, 47; 148/DIG. 105

[56] References Cited

U.S. PATENT DOCUMENTS

| | | | |
|---|---|---|---|
| 4,646,424 | 3/1987 | Parks et al. | 437/40 |
| 5,032,531 | 7/1991 | Tsutsui et al. | 437/40 |
| 5,094,978 | 3/1992 | Miyagaki et al. | 437/181 |
| 5,210,045 | 5/1993 | Possin et al. | 437/181 |
| 5,407,845 | 4/1995 | Nasu et al. | 437/40 |

FOREIGN PATENT DOCUMENTS 3271720 12/1991 Japan ...................... 437/181

Primary Examiner—Brian E. Hearn
Assistant Examiner—Michael Trinh
Attorney, Agent, or Firm—Faegre & Benson

[57] ABSTRACT

A method for fabricating an LCD-TFT, which can prevent degradation of image quality of a liquid crystal display by preventing blackening of the pixel electrode due to $H_2$ plasma at the time of deposition of a protective insulation film. The method includes the steps of forming a gate electrode on a transparent glass substrate, and forming a gate insulation film, a semiconductor layer, and an impurity doped semiconductor layer successively over the surface of the substrate. The semiconductor layer and the impurity doped semiconductor layer are patterned, leaving layers only over a part of the gate insulation film over the gate electrode. A pixel electrode is formed on a part of the gate insulation film offset from the gate electrode. A metal barrier layer and source/drain electrodes are over the surface of the substrate. The metal barrier layer and the source/drain electrodes are patterned so as to expose the impurity doped semiconductor layer over the gate electrode and to cover all the surface of the pixel electrode. The semiconductor layer under the impurity doped semiconductor layer is exposed by carrying out a selective etching of the exposed impurity doped semiconductor layer with the metal barrier layer and the source/drain electrodes used as masks. A protective insulation layer is formed over the surface of the substrate, and the pixel electrode is exposed by selectively removing the protective insulation layer, the metal barrier layer and the source/drain electrodes over the pixel electrode.

1 Claim, 4 Drawing Sheets

METHOD FOR FABRICATING A THIN FILM TRANSISTOR FOR A LIQUID CRYSTAL DISPLAY

BACKGROUND OF THE INVENTION

1. Field of the Invention

This invention relates to a liquid crystal display. In particular, the present invention is a method for fabricating a thin film transistor for a liquid crystal display, which can prevent blackening of a pixel electrode.

2. Description of the Related Art

A conventional method for fabricating a thin film transistor for a liquid crystal display is to be explained hereinafter, referring to FIGS. 1a–1h. First, as shown in FIG. 1a, a gate electrode 2 is formed by depositing and patterning metal on a transparent glass substrate 1, and as shown in FIG. 1b, a gate insulation film 3 is formed over the substrate 1 and the gate electrode 2. A semiconductor layer 4 is then formed over gate insulation film 3 and an n+ type ohmic contact layer 5 is formed over the semiconductor layer 4.

Next, as shown in FIG. 1c, the semiconductor layer 4 and the n+ type ohmic contact layer 5 are patterned to leave them only over an area on the gate insulation film 3 over the gate electrode 2. As shown in FIG. 1d, a pixel electrode 6 is then formed on a part of the gate insulation film 3 offset from the gate electrode 2, by depositing and patterning an ITO (Indium Tin Oxide) film.

Next, as shown in FIG. 1e, a metal barrier layer 7, a source electrode 8-1 and a drain electrode 8-2 are formed over the semiconductor layer 4 and the n+ type ohmic contact layer 5, except over the gate electrode 2. Source electrode 8-1 and drain electrode 8-2 are formed by forming a metal barrier layer and a metal layer for the source/drain electrodes, successively over the whole surface of the substrate, and patterning the metal barrier layer and the metal layer.

Because of the formation of the source/drain electrodes 8-1 and 8-2, an upper surface of the n+ type ohmic layer 5 over the gate electrode 2 is exposed. The source electrode 8-1 and the metal barrier layer 7 under the source electrode 8-1 are formed over the semiconductor layer 4 and the pixel electrode 6. The source electrode 8-1 and the metal barrier layer 7 under the source electrode 8-1 are therefore electrically connected to the pixel electrode 6.

As shown in FIG. 1f, the n+ type ohmic layer 5 exposed between the source/drain electrode 8-1 and 8-2 is then etched away. The patterned source/drain electrodes 8-1 and 8-2 and the metal barrier layer 7 are used as masks during the etching process. As a result of the etching, a surface of the semiconductor layer 4 under the ohmic layer is exposed.

As shown in FIG. 1g, a protective insulation layer 9 is deposited over the whole surface of the substrate. As shown in FIG. 1h, the protective insulation film 9 is then patterned to expose the pixel electrode 6. The thin film transistor for a liquid crystal display is thereby completed.

The foregoing conventional method for fabricating an LCD 10 TFT causes blackening. Transparent films of $In_2O_3$ and $SnO_2$ precipitate into non-transparent metals of In and Sn due to depletion of oxygen from the ITO film comprising the pixel electrodes because of $H_2$ plasma during deposition of the protective insulation layer 9. When, as shown in FIG. 1g, the protective insulation layer 9 is deposited over the surface of the substrate, the pixel electrode 6 formed of ITO film is exposed, reducing rate of transmission of the pixel electrode and subsequently degrading the image quality.

SUMMARY OF THE INVENTION

An object of this invention is to provide a method for fabricating an LCD-TFT, which can prevent degradation of the image quality of a liquid crystal display by preventing blackening of pixel electrodes due to $H_2$ plasma exposure during the deposition of a protective insulation film.

These and other objects and features of this invention can be achieved by providing a new method for fabricating a thin film transistor for a liquid crystal display. The method includes the steps of forming a gate electrode on a transparent glass substrate, forming a gate insulation film, a semiconductor layer, and an impurity doped semiconductor layer successively over the whole surface of the substrate having the gate electrode formed. The semiconductor layer and the impurity doped semiconductor layer is patterned leaving only an area on a part of the gate insulation film over the gate electrode. A pixel electrode is then formed on a part of the gate insulation film offset from the gate electrode. A metal barrier layer and source/drain electrodes are formed over the whole surface of the substrate. The metal barrier layer and the source/drain electrodes are patterned so as to expose the impurity doped semiconductor layer over the gate electrode and to cover the whole surface of the pixel electrode. The semiconductor layer under the impurity doped semiconductor layer are exposed by carrying out a selective etching of the exposed impurity doped semiconductor layer with the metal barrier layer and the source/drain electrodes used as masks. A protective insulation layer is formed over the whole surface of the substrate. Finally, the pixel electrode is exposed by selectively removing the protective insulation layer, the metal barrier layer and the source/drain electrodes over the pixel electrode.

DETAILED DESCRIPTION OF THE INVENTION

Figure 1A:
FIGS. 1a–1h are sectional views showing a conventional method for fabricating a thin film transistor for a liquid crystal display.
Figure 1B:
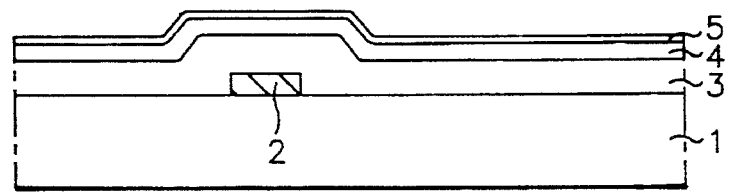
Figure 1C:
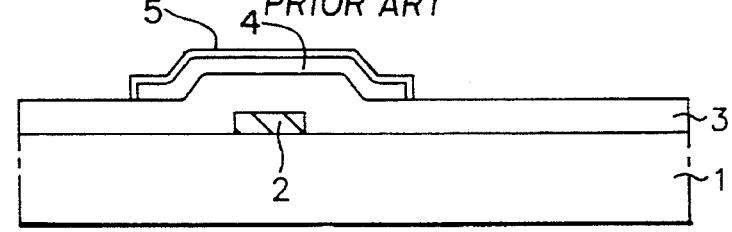
Figure 1D:
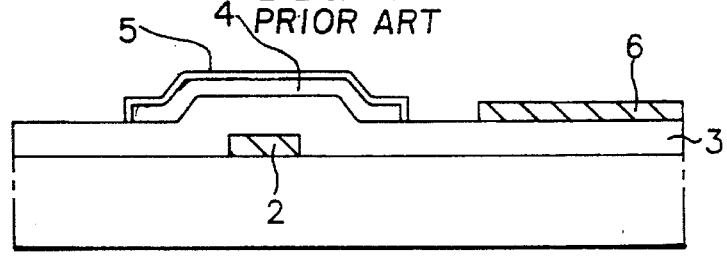
Figure 1E:
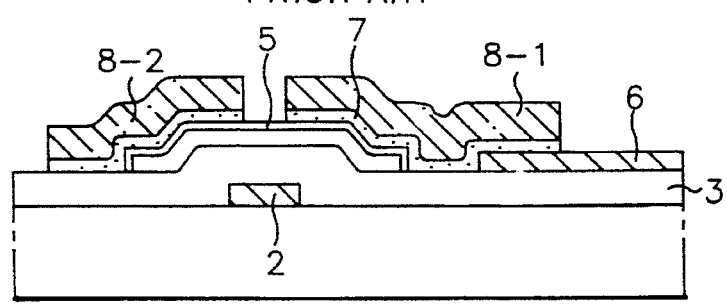
Figure 1F:
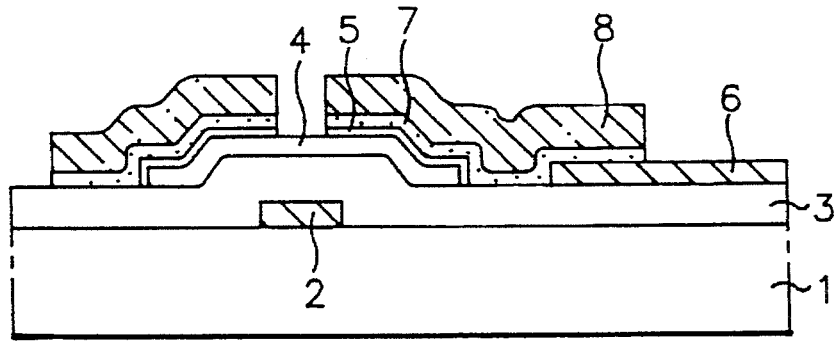
Figure 1G:
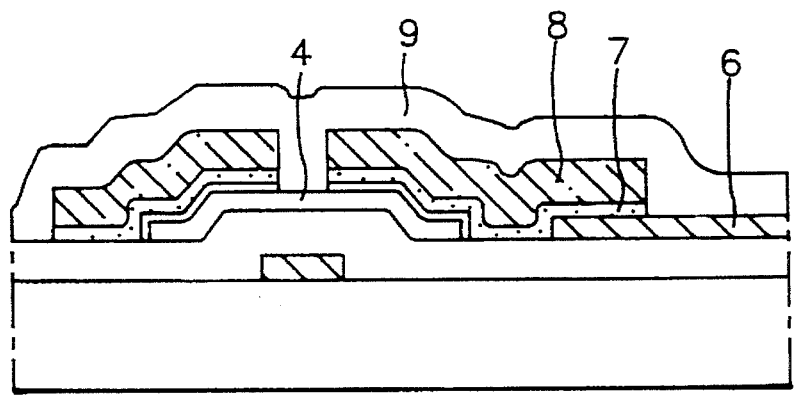
Figure 1H:
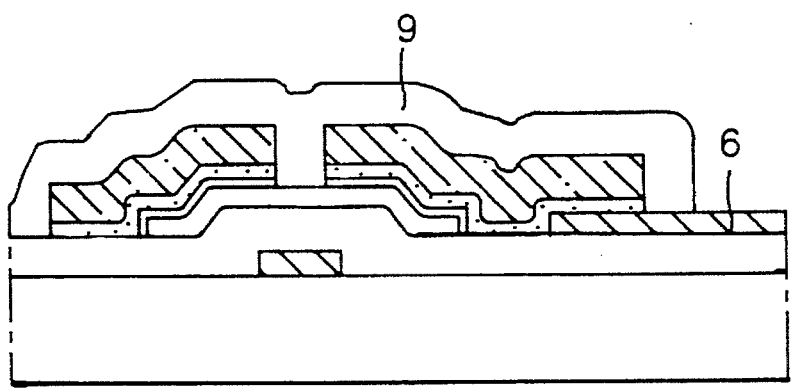
Figure 2A:
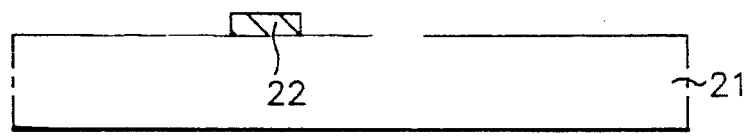
FIGS. 2a–2h are sectional views showing a new method for fabricating a thin film transistor for a liquid crystal display in accordance with the present invention.
Figure 2B:
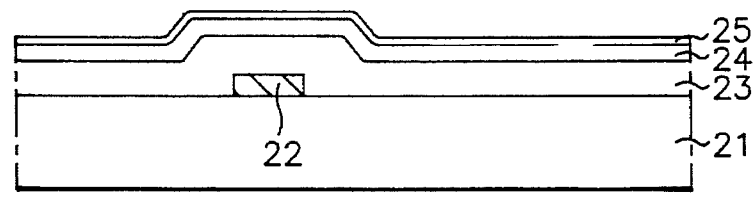
Figure 2C:
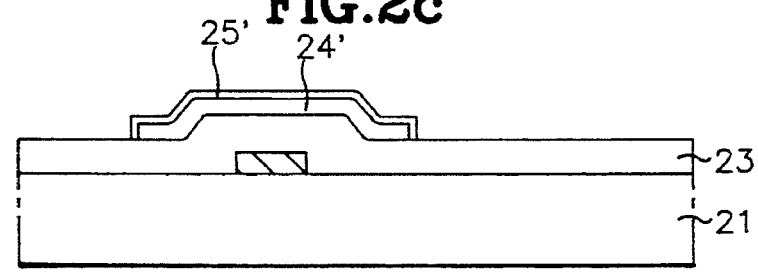

FIGS. 2a–2h, illustrate, in order of process, a method for fabricating a thin film transistor for a liquid crystal display in accordance with this invention. First, as shown in FIG. 2a, a gate electrode 22 is formed by depositing and etching metal on a transparent glass substrate 21. As shown in FIG. 2b, a gate insulation film 23 is formed over the whole substrate 21, including the gate electrode 22. An amorphous semiconductor layer 24 and an n+ type impurity doped semiconductor layer 25 as an n+ type ohmic layer are then formed successively over substrates 21 and electrode 22. As shown in FIG. 2c, an n+ type ohmic layer 25' and a semiconductor layer 24' are then formed on the gate insulation film 23 over the gate electrode 22 by patterning of the amorphous semiconductor layer 24 and the n type impurity doped amorphous semiconductor layer 25.

Figure 2D:
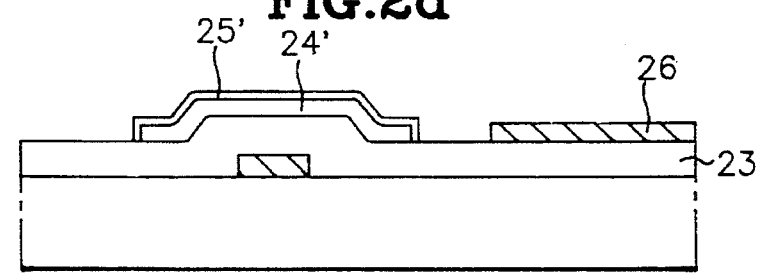
Figure 2E:
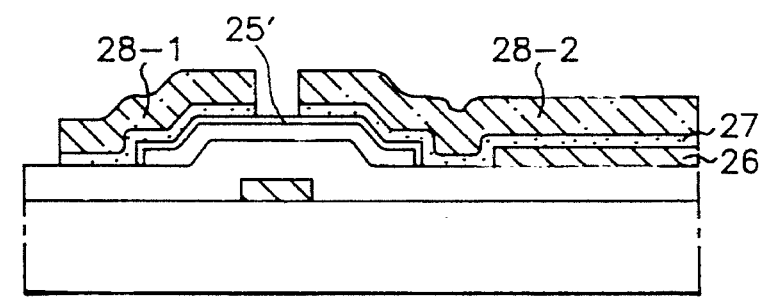

As shown in FIG. 2d, a pixel electrode 26 of a transparent conductive film (ITO) is formed on a part of the gate insulation film 23 offset from the gate electrode 22. Next, as shown in FIG. 2e, by successively forming a metal barrier layer and a metal layer for source/drain electrodes over the whole surface of the substrate, and patterning the metal barrier layer and the metal layer for source/drain electrodes, a metal barrier layer 27 and source/drain electrodes 28-1 and 28-2 are formed.

Figure 2F:
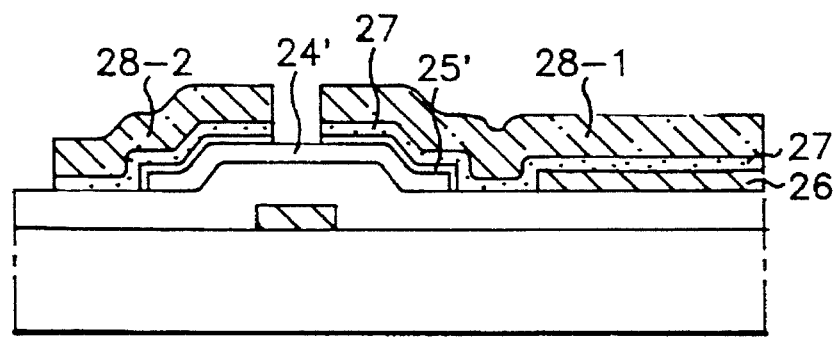

During the process described above, the patterning of the metal barrier layer and the source/drain electrodes is carried out so that the n+ type ohmic layer 25' between the source/drain electrodes 28-1 and 28-2 is exposed, and the metal barrier layer 27 and the source electrode 28-1 cover all the surface of the previously formed pixel electrode 26. Then, as shown in FIG. 2*f*, the exposed n+ type ohmic layer 25' between the source/drain electrodes 28-1 and 28-2 is etched using the source/drain electrodes 28-1 and 28-2 and the metal barrier layer 27 under the source/drain electrodes 28-1 and 28-2 as masks.

Figure 2G:
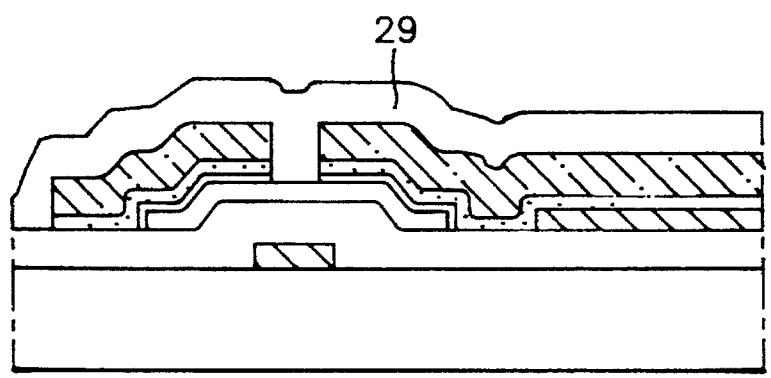
Figure 2H:
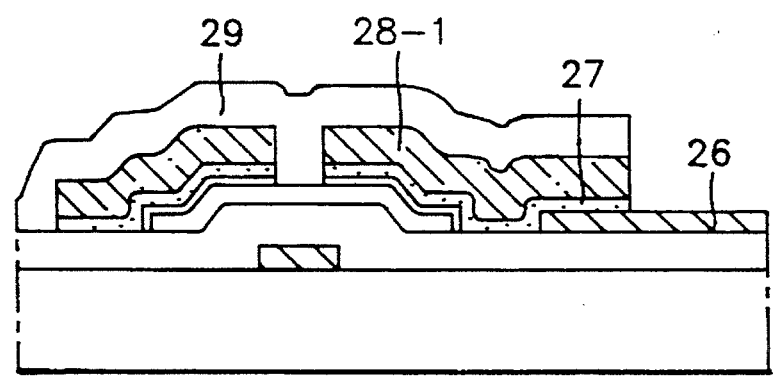

A protective insulation layer 29 is deposited over the whole surface of the substrate as shown in FIG. 2*g*. The pixel electrode 26 is exposed by successive etching of the protective insulation layer 29, the source electrode 28-1 and the metal barrier layer 27 as shown in FIG. 2*h*. The thin film transistor for a liquid crystal display in accordance with this invention is thereby completed.

According to the present invention, it is possible to prevent development of blackening and subsequent reduction of the transmission rate of the pixel electrode due to the exposure of the pixel electrode to $H_2$ plasma at the time of deposition of the protective insulation layer. This object is obtained with a simple method, without any additional process steps, by forming the protective insulation layer while the pixel electrode is covered with the metal barrier layer and the source electrode has no exposure to the surface, and carrying out patterning of the protective insulation layer together with the source/drain electrodes and the metal barrier layer at the time of etching of the protective insulation layer. Accordingly, it is possible to improve the performance of the pixel electrode and the transmission of charge of a liquid crystal. It is therefore also possible to improve the performance of a liquid crystal display.

Although the present invention has been described with reference to preferred embodiments, those skilled in the art will recognize that changes can be made in form and detail without departing from the spirit or scope of this invention.

What is claimed:

1. A method for fabricating a thin film transistor for a liquid crystal display, comprising:

forming a gate electrode on a transparent glass substrate;

forming a gate insulation film over the glass substrate;

forming a first semiconductor layer over the gate insulation film;

forming an impurity doped second semiconductor layer over the surface of the first semiconductor layer;

patterning the semiconductor layers so that the semiconductor layer and the impurity doped semiconductor layer are left on a part of the gate insulation film over the gate electrode;

forming a pixel electrode on a part of the gate insulation film offset from the gate electrode;

forming a metal barrier layer and source/drain electrodes over the surface of the glass substrate;

patterning the metal barrier layer and the source/drain electrodes to expose the impurity doped semiconductor layer over the gate electrode while covering the surface of the pixel electrode;

exposing the semiconductor layer under the impurity doped semiconductor layer by selectively etching the exposed impurity doped semiconductor layer with the metal barrier layer and the source/drain electrodes used as masks;

forming a protective insulation layer over the whole surface of the substrate; and, exposing the pixel electrode by selectively removing the protective insulation layer, the metal barrier layer and the source/drain electrodes over the pixel electrode.

* * * * *